(12) United States Patent
Erdim et al.

(10) Patent No.: US 8,935,138 B2
(45) Date of Patent: Jan. 13, 2015

(54) ANALYZING VOLUME REMOVED DURING MACHINING SIMULATION

(75) Inventors: Huseyin Erdim, Somerville, MA (US); Alan Sullivan, Middleton, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 247 days.

(21) Appl. No.: 13/432,871

(22) Filed: Mar. 28, 2012

(65) Prior Publication Data

US 2013/0262065 A1     Oct. 3, 2013

(51) Int. Cl.
*G06G 7/48*     (2006.01)
*G06F 17/50*     (2006.01)
*G05B 19/4097*     (2006.01)

(52) U.S. Cl.
CPC ........... *G05B 19/4097* (2013.01); *G06F 17/50* (2013.01); *G06F 17/5018* (2013.01); *G06F 17/5009* (2013.01)
USPC .......................................................... 703/7

(58) Field of Classification Search
CPC . G06F 17/50; G05B 19/4061; G05B 19/4069
USPC ........ 703/21, 2, 6, 7; 345/418, 419, 420, 421, 345/422, 423, 424, 426, 427, 428, 620
See application file for complete search history.

(56) References Cited

U.S. PATENT DOCUMENTS

| | | | |
|---|---|---|---|
| 5,710,709 A * | 1/1998 | Oliver et al. | 700/184 |
| 6,072,497 A * | 6/2000 | Lichtenbelt et al. | 345/424 |
| 6,341,996 B1 * | 1/2002 | Brien et al. | 451/8 |
| 7,586,494 B2 * | 9/2009 | Wang et al. | 345/581 |
| 8,073,190 B2 * | 12/2011 | Gloudemans et al. | 382/100 |
| 2002/0133264 A1 | 9/2002 | Maiteh et al. | |
| 2003/0083773 A1 * | 5/2003 | Schwanecke et al. | 700/182 |
| 2003/0171840 A1 * | 9/2003 | Haupt | 700/175 |
| 2003/0204284 A1 * | 10/2003 | Thomas et al. | 700/175 |
| 2004/0054433 A1 * | 3/2004 | Kobbelt | 700/187 |
| 2007/0070073 A1 * | 3/2007 | Davis et al. | 345/474 |
| 2009/0027382 A1 * | 1/2009 | Yang et al. | 345/419 |
| 2009/0102842 A1 * | 4/2009 | Li | 345/422 |
| 2009/0225077 A1 * | 9/2009 | Sudarsky et al. | 345/423 |
| 2009/0295803 A1 * | 12/2009 | Young et al. | 345/424 |
| 2010/0298961 A1 * | 11/2010 | Frisken et al. | 700/103 |

OTHER PUBLICATIONS

Frisken et al., Adaptively Sampled Distance Fields: A General Represenation of Shape for Computer Graphics, SIGGRAPH 2000, New Orleans, LA, ACM 2000 pp. 249-254.*
Department of Mathematics, Oregon State University, Coordinate Systems in Two and Three Dimensions, 1997, http://www.math.oregonstate.edu/home/programs/undergrad/CalculusQuestStudyGuides/vcalc/coord/coord.html.*

(Continued)

*Primary Examiner* — Kamini S Shah
*Assistant Examiner* — Scott S Cook
(74) *Attorney, Agent, or Firm* — Dirk Brinkman; Gene Vinokur

(57) ABSTRACT

A method simulates a machining of a workpiece by a tool. The method populates a swept volume representing a motion of the tool in relation to the workpiece with a set of rays, and determines a volume removed from the workpiece by the swept volume based on intersections of at least some rays with the workpiece. A model of the workpiece is modified based on the removed volume.

14 Claims, 12 Drawing Sheets

(56) References Cited

OTHER PUBLICATIONS

Huang, Y., Oliver, J.H., Integrated Simulation, Error Assessment, and Tool Path Correction for Five-Axis NC Milling, Journal of Manufacturing Systems, vol. 14/No. 5 1995.*

Huang, Y., Oliver, J.H., NC Milling Error Assessment and Tool Path Correction, ACM 1994 ISBN: 0-89791-667-0.*

Yuksek, K., Zhang, W., Ridzalski, B.I., Leu, M.C., A New Contour Reconstruction Approach from Dexel Data in Virtual Sculpting 2008 IEEE DOI 10.1109/GMAI.2008.27.*

Peng, X., Leu, M.C., 3 Interactive Solid Modeling in a Virtual Environment with a Haptic Interface, Virtual and Augmented Reality Applications in Manufacturing, Springer-Verlag London 2004.*

Stiffer, S., Simulation of NC Machining Based on the Dexel Model: A Critical Analysis, Int J Adv Manuf Technology (1995) 10:149-157.*

Wang W.P. et al. "Geometric Modeling for Swept Volume of Moving Solids," IEEE Computer Graphics and Applications, IEEE Service Center, NY, NY, US. vol. 4, No. 12. Dec. 1, 1986. pp. 8-17.

Jingzhou Yang et al. "Verification of NC Machining Processes using Swept Volumes," The International Journal of Advanced Manufacturing Technology, Springer, Berlin, DE. vol. 28, No. 1-2. Feb. 1, 2006. pp. 82-91.

* cited by examiner

ANALYZING VOLUME REMOVED DURING MACHINING SIMULATION

FIELD OF THE INVENTION

The invention relates generally to analyzing a volume removed by a tool intersecting a workpiece, and more particularly to determining geometric properties of the volume removed from the workpiece during a simulation of machining the workpiece by the tool.

BACKGROUND OF THE INVENTION

NC Milling

Simulating numerically controlled (NC) milling is of fundamental importance in computer aided design (CAD) and computer aided manufacturing (CAM). During simulation, a computer model of a workpiece is edited with a computer representation of an NC milling tool and a set of NC milling tool motions to simulate the milling process.

The workpiece model and tool representation can be visualized during the simulation to detect potential collisions between parts, such as the workpiece and the tool holder, and after the simulation to verify the final shape of the workpiece.

The final shape of the workpiece is affected by the selection of the tool and the tool motions. Instructions for controlling the motions are typically generated using the CAM system from a graphical representation of the desired final shape of the workpiece. The motions are typically implemented using numerical control programming language, also known as preparatory code or G-Codes, see, e.g., the RS274D and DIN 66025/ISO 6983 standards.

The G-Codes generated by the CAM system may not produce an exact replication of the desired shape. In addition, the movement of the NC tool is governed by operational parts of the NC milling machine, which can have constrained speeds, ranges of motion, and abilities to accelerate and decelerate. Therefore, the actual tool motions may not exactly follow the NC machine instructions.

Discrepancies between the final shape of the workpiece and the desired shape of the workpiece may be very small. In some situations, these discrepancies can result in undesirable gouges or nicks in the surface of the final shape of the workpiece with sizes on the order of a few micrometers in depth and width, and tens of micrometers in length.

Typically, a set of NC machine instructions is tested by milling a test workpiece made of a softer, less expensive material prior to milling the desired part. If visual inspection of the test workpiece locates undesirable discrepancies in the test workpiece, the NC machine instructions can be modified accordingly.

This manual testing is time consuming and expensive. Time for machining a single test workpiece may be on the order of hours and several iterations may be required before an acceptable set of NC machine instructions is attained. Thus, it is desirable to test for these discrepancies using computer-based simulation and rendering. However, in order to detect discrepancies with dimensions on the order of a few micrometers for workpieces, which may have dimensions on the order of one meter, very precise computer models are required. It is an object of the present invention to provide a space and time efficient method for representing and rendering such high precision models for milling simulation.

Swept Volumes

During milling, the tool moves relative to the workpiece according to a prescribed tool motion, referred to herein as a tool path. The tool path can contain information about the relative position, orientation, and other shape data of the tool with respect to the workpiece.

As the tool moves along the tool path, the tool carves out a "swept volume." During milling, as the tool moves along the tool path, a portion of the workpiece that is intersected by the swept volume is removed. This material removal can be modeled computationally as a constructive solid geometry (CSG) difference operation, in which the portion of the workpiece is removed from the workpiece using a CSG subtraction operation of the swept volume from the workpiece.

Although NC milling simulation is used as an example application, swept volumes have applications in many areas of science, engineering, entertainment, and computer graphics. Some specific applications include computer-aided design, freeform design, computer-based drawing, animation, solid modeling, robotics, manufacturing automation, and visualization to name but a few. The following description applies to all areas where an accurate representation of a swept volume is required, or desired.

Although this description focuses on three-dimensional coordinate systems, the term 'swept volume' can be extended more generally to N-dimensional coordinate systems. In particular, the following description also applies to areas swept out by a one-dimensional or two-dimensional shape moving along a path in a two-dimensional space, or to a hyper-volume swept out by a shape moving over a path or surface in higher dimensional systems.

An overview of the importance and challenges in swept volume research is presented by Abdel-Malek, Blackmore, and Joy in "Swept Volumes: Foundations, Perspectives, and Applications", International Journal of Shape Modeling, 2006. They conclude that research in this field is limited by the difficulty of implementing complex mathematical formulations of swept volumes using software, and that computing the boundaries of swept volumes remains a challenging problem requiring better visualization tools and more accurate methods.

The swept volumes of simple shapes moving along simple paths can sometimes be represented analytically, as described in U.S. Pat. No. 4,833,617. However, those methods do not generalize to complex shapes and complex tool paths.

Several methods approximate the swept volumes of polygonal shapes. Models of polygonal shapes can be encoded in a spatial hierarchy for efficient editing via CSG operations as in "Interactive CSG" Proceedings, Technical Sketches, SIGGRAPH, 1999, Butcher, or for efficient collision detection as in U.S. Pat. No. 6,099,573. A method for approximating the swept volume of a polygonal object is also described in "Computing Swept Volumes", Journal of Visualization and Animation, 2000, Abrams and Allen.

U.S. Pat. No. 6,862,560 describes a method for simulating machining using CSG operations on polygonal models of swept volumes. In that method, the boundary of the workpiece is encased in a set of cells, where each cell includes references to swept volume polygons that intersect the cell. Intersections between the workpiece and the swept volume polygons within a particular cell can be processed, on demand, to generate a high precision rendering of the milled surface for a small region of interest. However, visualizing the full model at high precision is extremely time consuming.

U.S. Pat. No. 6,993,461 describes representing an object as a polyhedron. The object is placed along the path at discrete time steps using a series of transformations. Edges and faces of the polyhedral representation that are on the boundary of the swept volume are determined at each time step and connected to each other to generate a polyhedral approximation of the swept volume.

The accuracy of each of those polygonal methods is limited by the polygonal representation of the object model. Billions of polygons may be required to accurately represent the curved surface of a complex tool, especially if the radius of curvature is small. Thus, those methods may either have limited accuracy or have prohibitive processing times and memory requirements for generating high precision models of swept volumes, or both. In addition, methods that approximate the swept volume as a series of discrete time steps have limited precision between the discrete time steps, and are subject to aliasing artifacts.

Another common representation for milling simulation is known as the Z-buffer or a Dexel method. That method is described in "Real-time Shaded NC Milling Display", Proceedings, SIGGRAPH 1986, van Hook. U.S. Pat. No. 7,149, 668 describes a similar method in which the workpiece is modeled by a grid of straight lines all in the z-direction, and the milling simulation is performed by moving the tool model over the grid and modifying the height of the lines representing the workpiece that are intersected by the tool.

The Dexel method typically suffers from limited resolution, especially in directions not aligned with the z-axis, and is not suitable for generating high precision models of swept volumes. The Dexel representation is related to voxel-based representations. In "Volume Visualization", IEEE Computer Society Press, 1991, Kaufman describes voxel-based representations as well as methods for rendering and processing voxel-based representations. "Sculpting: an Interactive Volumetric Modeling Technique", Proceedings, SIGGRAPH 1991, Galyean and Hughes, and "Volume Sculpting: Proceedings, SIGGRAPH 1995, Wang and Kaufman, both simulate sculpting using CSG operations on voxel-based representations of objects.

Methods that use binary voxels to represent swept volumes are described in U.S. Pat. No. 6,044,306, and "Method and Apparatus for Shaping Geometric Shapes" and "Octree-based Boundary Evaluation for General Sweeps", Proceedings, TMCE, 2008 Erdim and Ilies. The accuracy of those methods is limited by the size of the smallest voxel used to represent the swept volumes.

Distance Fields

Distance fields are an effective representation for rendering and editing shapes, as described in U.S. Pat. Nos. 6,396,492, 6,724,393, 6,826,024, and 7,042,458.

Distance fields are a form of implicit functions that represent an object. A distance field is a scalar field that gives a shortest distance to the surface of the object from any point in space. A point at which the distance field is zero is on the surface of the object. The set of points on the surface of the object collectively describe the boundary of the object, also known as the d=0 isosurface. Generally, the distance field of an object is positive for points inside the object, and a negative for points outside the object, although the sign can be inverted.

Distance fields have been used to represent and render swept volumes. "Sweeping of Three Dimensional Objects", Computer Aided Design, 20(4), 1990, Martin and Stephenson, described a theoretical foundation for defining the envelope of a swept volume in terms of an implicit function. In "Function Representation for Sweeping by a Moving Solid", Proceedings, Solid Modeling, 1995, Sourin and Pasko represented swept volumes using implicit surfaces. However, implicit surfaces can be difficult to render, and a suitable implicit representation for an arbitrarily complex tool shape is difficult to define.

A procedure for computing the distance field of an object is called a distance field function. For very simple objects, such as a plane, a sphere or a cylinder, the distance field function can be an analytic function with a closed form. For more complex objects the analytic function may impossible. However, a numerical procedure can still be possible. For example, U.S. Pat. No. 2010/0298967 describes a numerical procedure for determining the distance field of a swept object, such as a swept milling tool.

Adaptively sampled distance fields (ADFs) use detail-directed sampling to provide a much more space and time efficient representation of distance fields than is obtained using regularly sampled distance fields. ADFs store the distance field as a spatial hierarchy of cells. Each cell contains distance data and a reconstruction method for reconstructing a portion of the distance field associated with the cell. Distance data can include the value of the distance field, as well as the gradient and partial derivatives of the distance field. The distance field within a cell can be reconstructed as needed to reduce memory and computational complexity.

ADFs can be used to simulate editing using CSG operations. The model to be edited and the editing tool can be represented as distance functions, regularly sampled distance fields, or ADFs. The editing process can generate the ADF of the edited shape explicitly, for example by modifying the ADF of the model.

Alternatively, the edited shape can be represented implicitly as a composite ADF (CADF). The CADF is generated to represent the object, where the CADF includes a set of cells arranged in the spatial hierarchy. Each cell in the CADF includes a subset of the set of geometric element distance field functions and a reconstruction method for combining the subset of geometric element distance field functions to reconstruct a composite distance field of a portion of the object represented by the cell. Each distance field in the subset of distance fields forms a part of the boundary of the object within the cell, called the composite boundary.

CADFs can reconstruct the distance field of a milled object with a very high accuracy. The distance field function of the set of geometric elements can be computed with high accuracy by analytic or numerical methods, and values of the distance field functions can be combined with high accuracy. The resulting surface is very detailed with surface features that may be smaller than 1 micron for a simulated object that is about one cubic meter.

Geometric Properties of Removed Volume

During milling, as the NC milling tool moves along the tool path, the tool can be in contact with the workpiece. As the tool moves relative to the workpiece, the tool generates the swept volume. A portion of the workpiece that is intersected by the swept volume is removed, and is a "removed volume." The workpiece that is updated by the removed volume is an "in-process workpiece."

The simulation of the milling requires an accurate modeling of the material removed by the milling tool due to each tool movement. Accordingly, there is a need to determine the removed volume or an accurate geometric representation of the removed volume.

Currently, Computer Aided Design (CAD)/Computer Aided Manufacturing (CAM) systems that generate tool path information employ the geometric and volumetric analysis to select parameters of a simulation. Average milling forces are assumed to be proportional to the material removal rate (MRR) during any particular instant. The removed volume is divided by a tooth passing frequency of milling tool to determine the average MRR for each tool movement, where the tooth passing frequency is the frequency of a teeth that engages with the workpiece and obtained by multiplying the number of teeth of milling tool and spindle speed.

Average milling forces are analyzed using the MRR determined from removed volume, and the power required to mill the material is proportional to the MRR. Spindle power and specific energy consumed in removing a unit volume of material can also be used in order to increase the performance of the machining. In addition computing the removed volume, other geometric properties of removed volume, such as mass, center of mass, surface area, moment of inertia, length, width and thickness can also be computed to use for process analysis. The moment of inertia of the removed volume is used for estimating the stresses applied by the milling tool to the workpiece, and later estimating the residual stresses left on the machined surface.

Volume computation of solid bodies is fundamental to many geometric applications. An overview of the importance and challenges in volume computation is described by Lee and Requicha in "Algorithms for computing the volume and other integral properties of solids. I. Known methods and open issues," Communications of the ACM, 1982. Determining accurate moments and volumes of solids removed by milling tool along the tool path is difficult due to the presence of curved freeform surfaces. Therefore, the volumes are currently being computed by commercial software by first evaluating and tessellating the surfaces and computing the volumes of the tessellated objects as described in "ACIS Geometric Modeler: User Guide v20.0," 2009, Spatial Corporation.

Another common method for volume calculation is converting the volume integrals to surface integrals by using a divergence theorem. That approach is described by Gonzalez-Ochoa, McCammon and Peters in "Computing moments of objects enclosed by piecewise polynomial surfaces," Journal ACM Transactions on Graphics, 1998. Polyhedral approximations indicate that accurate evaluation of integral properties of curved objects via polyhedral approximations may require the use of polyhedral with a large number of faces. Numerical integration techniques are used to evaluate surface integrals of for a given polyhedral approximation. However, one of the main limitations is the level of tessellation in order to guarantee the accuracy of result.

Cellular approximations by using regular or octree subdivision are related to voxel-based representations, and these methods have accuracy and memory limited by the size of the smallest voxel used to represent the removed volume. For example, one method uses recursive subdivision surfaces as described by Peters and Nasri in "Computing Volumes of Solids Enclosed by Recursive Subdivision Surfaces," EUROGRAPHICS 1997. That method computes the volume by estimating the volume of the local convex hull near extraordinary point. However the close-form representation of implicit, explicit or parametric forms is not always available, especially in NC milling case.

Several methods determine the geometric properties of solids using GPUs (Graphic Processing Units) for solids represented by NURBS (Non-Uniform Rational B-Spline) surfaces. Those methods include a method described by Kim, Kim, Ko and Terzopoulos in "Fast GPU computation of the mass properties of a general shape and its application to buoyancy simulation." The Visual Computer International Journal of Computer Graphics, 2006, and a method described by Krishnamurthy and McMains in "Accurate GPU-accelerated surface integrals for moment computation," Computer Aided Design Journal, 2011. Although NURBS surfaces are used for high degree of freedom of modeling with smooth continuity of differential properties, the used Boolean operations do not provide accurate result for NC milling simulation systems.

Thus there is a need a method for determining and analyzing the removed volume to be used for a simulation of machining the workpiece by the tool.

SUMMARY OF THE INVENTION

It is an object of various embodiments of an invention to provide a system and a method for determining a volume removed by a tool during a simulation of machining a workpiece by the tool. It is another object of some embodiments to determine geometric properties of removed volume. It is another object of some embodiments to determine the removed volume suitable to be used with arbitrary tools moving along an arbitrary tool path.

It is another object of some embodiments to provide a system and a method for determining and analyzing the removed volume to be used in simulation of a micro-milling, which is becoming an established process for manufacturing of micro mechanical components and components including micro features in a wide range of materials. There is a strong need for analysis of chip formations in micro milling, because variations in various condition of the milling result in variations in the width, thickness, length and volume of removed chips.

Various embodiments of the invention are based on a realization that a swept volume generated during machining simulation corresponds to a maximum potential removed volume. Hence, to determine the actual removed volume, various embodiments test a space defined, e.g., internal to the swept volume. In some embodiments, the internal space includes a silhouette of the swept volume. For example, some embodiments of the invention populate a space internal to the swept volume with a set of rays, and determine the removed volume based on intersections of the rays with the workpiece.

Accordingly, one embodiments of the invention discloses a method for simulating a machining of a workpiece by a tool. The method includes populating a swept volume representing a motion of the tool in relation to the workpiece with a set of rays; and determining a volume removed from the workpiece by the swept volume based on intersections of at least some rays with the workpiece. A model of the workpiece is modified based on the removed volume. The steps of the method are performed by a processor.

Another embodiment discloses a method for simulating a machining of a workpiece by a tool, wherein the workpiece is represented by a workpiece distance field, the tool is represented by a tool distance field, and the motion of the tool with respect to the workpiece is represented by a swept volume distance field. The method includes casting a set of rays within the swept volume; determining internal segments of the rays based on points on at least some rays resulting in corresponding zero values of the swept volume distance field and the workpiece distance filed; and combining the internal segments to determine a removed volume. The steps of the method are performed by a processor.

Yet another embodiment discloses a system for simulating a machining of a workpiece by a tool, wherein the workpiece is represented by a workpiece distance field, the tool is represented by a tool distance field, and the motion of the tool with respect to the workpiece is represented by a swept volume distance field. The system includes a processor for casting a set of rays in a space internal to the swept volume, and for determining a removed volume based on points on at least some rays resulting in zero values of the swept volume distance field and the workpiece distance filed.

DETAILED DESCRIPTION OF THE PREFERRED EMBODIMENT

System and Method Overview

Figure 1:
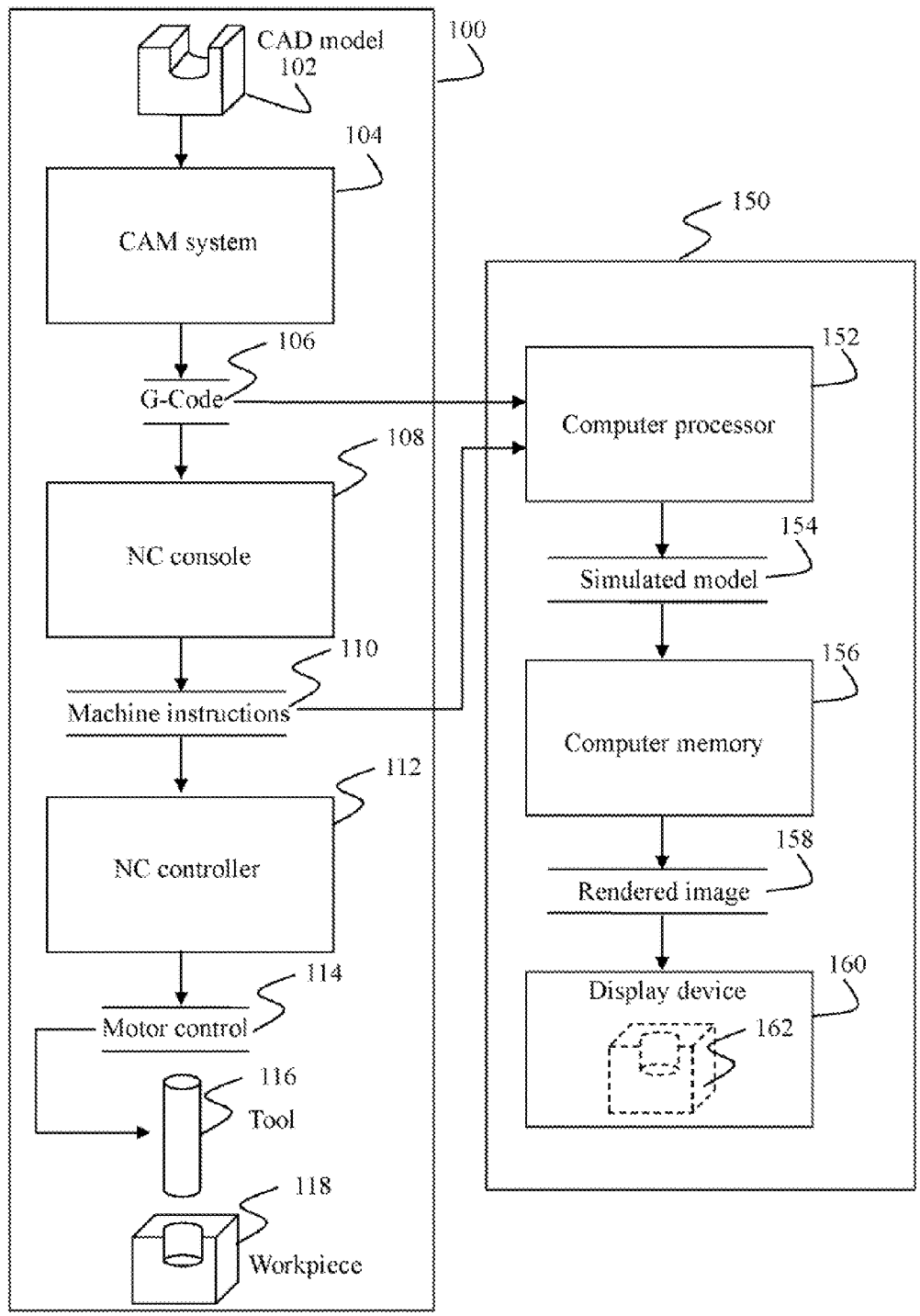
FIG. 1 is a flow diagram of an NC milling machine and a system and method for simulating NC milling according to embodiments of the invention.

FIG. 1 shows an NC milling system 100, and a numerically controlled (NC) milling simulation system 150. In the NC milling system 100, a computer aided design (CAD) model 102 is input to a computer aided manufacturing (CAM) system 104, which generates G-Codes 106 for controlling an NC milling machine. During NC milling, the G-Codes are input to an NC milling input interface 108, which processes each G-Code to produce a corresponding set of NC machine instructions 110. The NC machine instructions are input into an NC controller 112, which produces a set of motor control signals 114 to move a tool 116 relative to a workpiece 118 in order to mill the workpiece.

The simulation system 150 can take as input either the G-Codes 106 generated by the computer aided manufacturing system 104, or the NC machine instructions 110 generated by the NC console 108. The input to the simulation system is read by a computer processor 152, which simulates machining of the workpiece, and outputs a simulated model 154, which can be stored in a computer memory 156. The processor 152 can render the stored simulated model 154 to generate a rendered image 158 which can be output to a display device 160. A displayed image 162 can be compared to the computer aided design model 102 to verify the G-Codes 106 or NC machine instructions 110 prior to performing the actual NC milling of the workpiece.

Tools

Figure 2A:
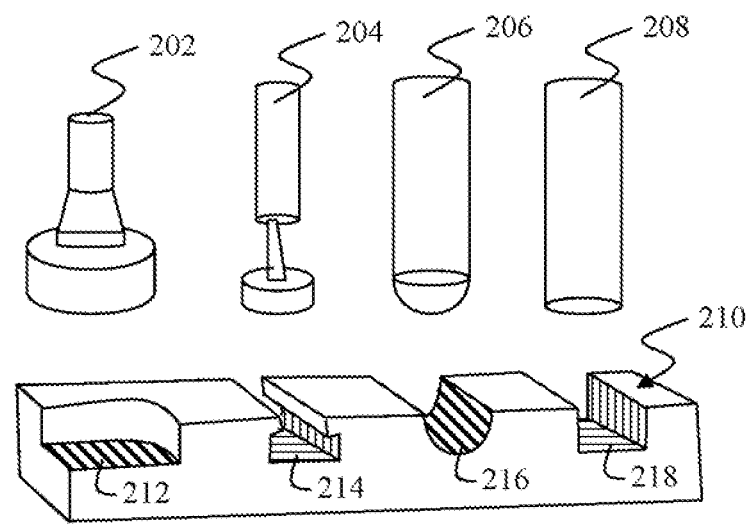
FIG. 2A is a diagram of typical tools used for milling and typical edits in a workpiece made by moving such tools along a path.

FIG. 2A shows a set of typical tool shapes 202, 204, 206, and 208 used in NC milling. When a tool is moved relative to a workpiece 210, the tool removes material from the workpiece. Here, the tools 202, 204, 206, and 208 remove material corresponding to surfaces 212, 214, 216, and 218 from the workpiece. The shape of the material removed by each tool is determined by the tool shape and the path of the tool relative to the workpiece. The shape of the material removed is the intersection of the workpiece and the swept volume of the tool as the tool moves along the path.

Although we focus here on NC milling simulation, swept volumes have applications in many areas of science, engineering, and computer graphics including computer-aided design, freeform design, solid modeling, robotics, manufacturing automation, and visualization.

Swept Volume

Figure 2B:
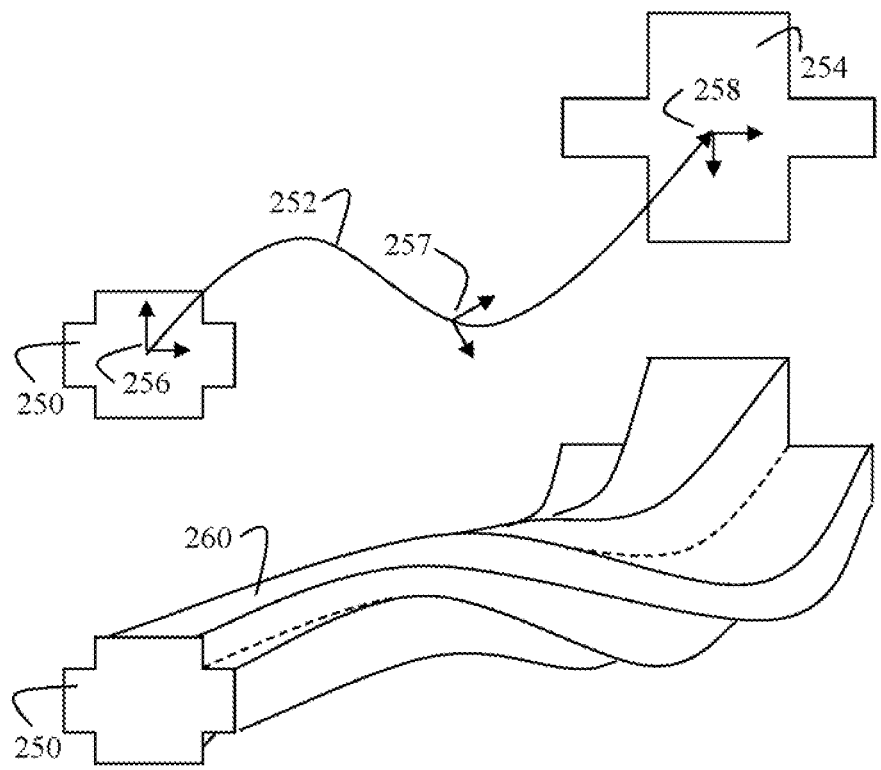
FIG. 2B is a schematic of a swept volume determined by sweeping a 2D shape along a curved path.

FIG. 2B shows the swept volume 260 of a shape 250 of a tool that is moved along a path 252. The path 252 specifies a position of a particular point of the shape 250 as a function of time. The path can specify an orientation 256, 257, and 258 of the shape as a function of time. The path can also specify a scale of the shape or an arbitrary transformation of the shape as a function of time. In FIG. 2B, the original position, orientation, and geometry of a shape 250 is transformed to a final position, orientation, and geometry of the shape 254 as it moves along the path.

Tool Paths

The path of the tool relative to the workpiece can be specified in many forms.

Figure 3A:
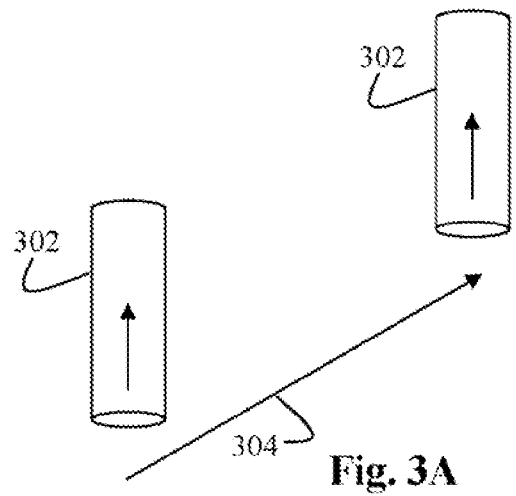
FIG. 3A is a schematic of a linear path of a tool.

FIG. 3A shows a linear path, in which a tool 302 is moved along a straight line 304.

Figure 3B:
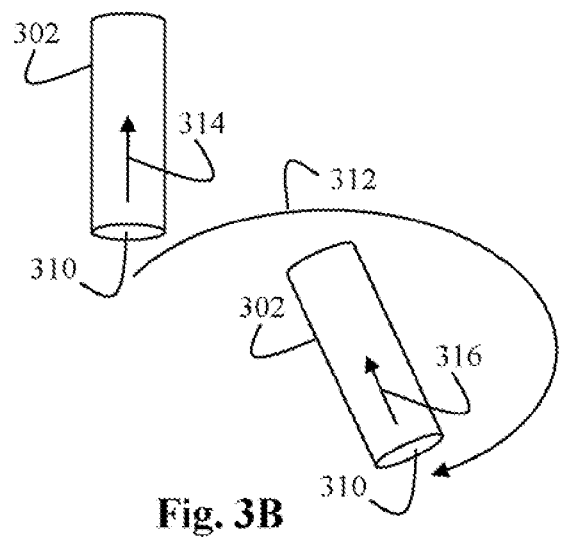
FIG. 3B is a diagram of an arc path of a tool in which the tool axis changes along the path.

FIG. 3B shows a circular arc path, in which a tip 310 of the tool 302 is moved along a circular arc 312, and an original axis direction 314 of the tool is transformed to a final axis direction 316 at the end of the path.

Figure 3C:
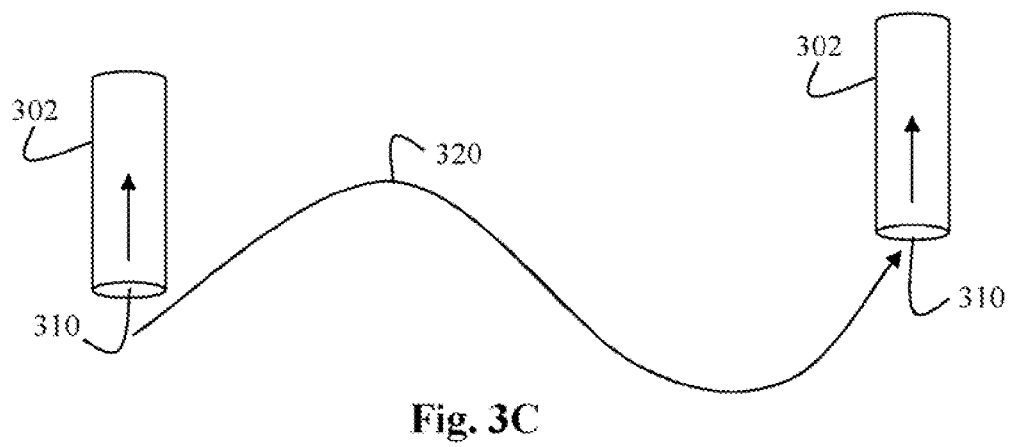
FIG. 3C is schematic of a curve path of a tool.

FIG. 3C illustrates a curved path, in which the tip 310 of the tool 302 is moved along a curve 320.

Other possible path forms include positioning the tool at a point, moving the tool along a sequence of lines known as a polyline, moving the tool along a spiral or helical curve, moving the tool along a polynomial curve, such as a quadratic Bezier curve or a cubic Bezier curve, or a sequence of polynomial curves known as a piecewise polynomial curve to name but a few. Any form of path that can be simulated can be considered, including a path defined by a procedure such as a path that is influenced by the shape or material composition of the workpiece.

Removed Volume

Figure 4A:
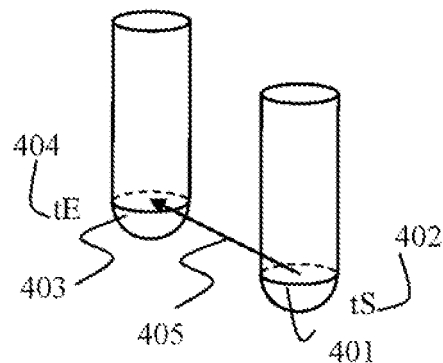
FIG. 4A is a diagram of creating swept volume between consecutive tool instances.
Figure 4B:
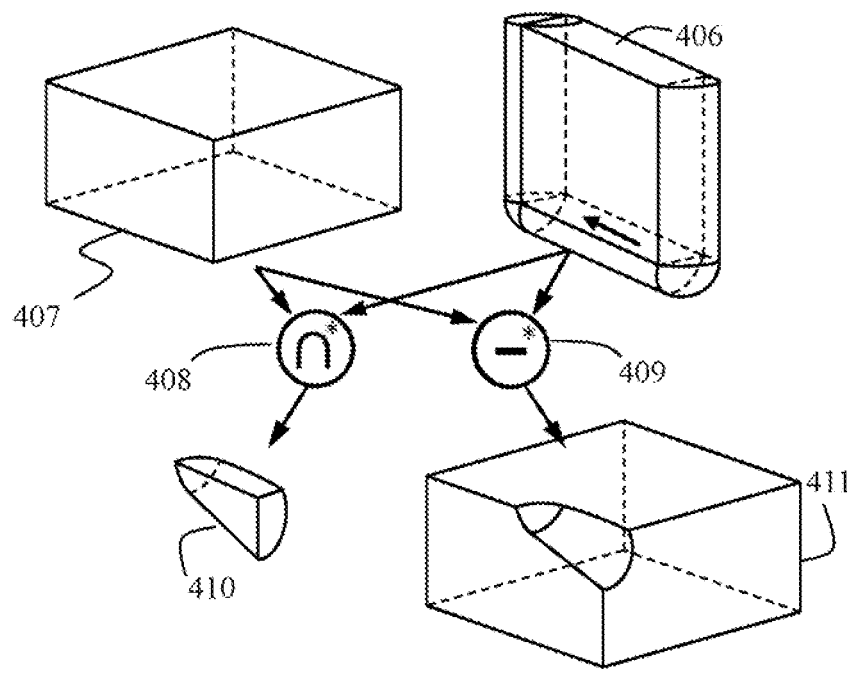
FIG. 4B is a diagram of method for determining the removed volume between the milling tool and in-process workpiece according to embodiments of the invention.
Figure 4C:
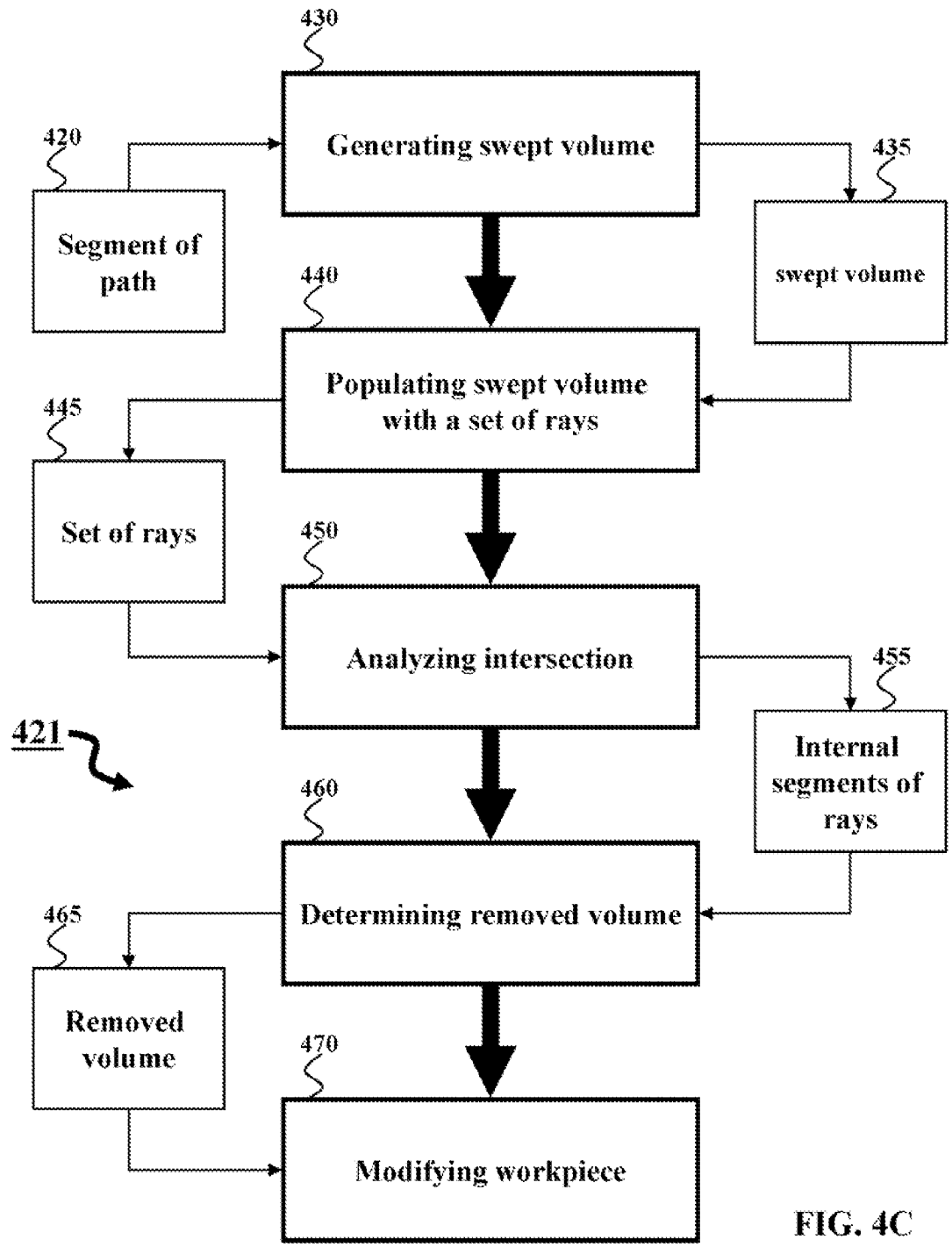
FIG. 4C is a block diagram of a method for simulating a machining of a workpiece by a tool according to embodiments of the invention.

FIGS. 4A-C show a removed volume determined during machining simulation according to various embodiments of the invention.

FIG. 4A shows a path 405 of the tool during the simulation. The path defines a relative motion between the tool and the workpiece. For example, a tool at start time tS 402 is moved from a previous position 401 to a next position 403 at an end time tE 404 along the path 405 resulting in a swept volume 406. In various embodiments, the path 405 can be of any type, e.g., a straight line or curved line. Also, the previous and the next position of the tool can represent the entire path of the tool during the simulation or represent a segment of that path.

FIG. 4B shows example of generation of in-process workpiece 411 and removed volume 410 by performing regularized intersection 408 or regularized difference operations 409 between the workpiece 407 and swept volume 406. Regularized Boolean operations ensure that the pair of solids always combines to yield solids.

When the swept volume 406 is generated, the swept volume is intersected with a solid model of the workpiece 407 to obtain the removed volume 410. In fact, the removed volume is also subtracted from the original model of the workpiece to obtain the finished workpiece.

Various embodiments of the invention are based on a realization that the swept volume corresponds to a maximum potential removed volume, so to determine the actual removed volume, the embodiments test a space defined, e.g., internal to the swept volume. For example, various embodiments of the invention populate a space internal to the swept volume with a set of rays, and determine the removed volume based on intersections of the rays with the workpiece inside the swept volume. The populating of volume with rays can be done using various computer graphic techniques and according to various sampling patterns, as described in more details below.

FIG. 4C shows a block diagram of a method for simulating a machining of a workpiece by a tool according to some embodiments of the invention. The method generates 430 a swept volume 435 representing a motion of the tool in relation to the workpiece. The motion of tool can be simulated according to a segment 420 of a path determined for the simulation of the machining. Next, the swept volume is populated 440 with a set of rays 445. The intersections of the rays with the workpiece are analyzed 450 to determine segments of the rays 455 internal to the workpiece. The volume 465 removed from the workpiece is determined 460 based on intersections of at least some rays with the workpiece. For example, the internal segments 455 of the ray form the removed volume, which can be determined based on a number of the internal segments, distance between the internal segments, and the corresponding length and thickness of the internal segments. The workpiece is modified 470 based on the volume, such that the machining is simulated. The steps of the method are performed by a processor 421.

The implicit representation is advantageous for determining whether a given point lies on a specific curve or surface. This motivates the use of distance fields and ray-surface intersections for determining removed volume. Additionally, the usage of ray casting allows computing the distances for each point along the ray until the ray intersects the surface. Especially, the distance fields differentiate by its sign information whether the point is within the swept volume or not. In some embodiments, the volume is represented by a continuous geometric surface along the tool path. However, the sampling of the surface can be difficult especially when the cross section of volume changes abruptly along the motion. Instead, a lower dimensional geometric entity, i.e., a line represented by the ray, is used to form the removed volume thus avoiding the sampling of the surface.

Although NC milling simulation is used as an example herein, determining the amount of swept volume and removed volume occurs in various problems of kinematics, manufacturing, robotics, design and ergonomics. Some specific practical applications include computing the amount of removed volume in order to adjust process parameters such as velocity and voltage values for plunge Electric Discharge Machining (EDM) process.

The volume swept by a tool moving along a path determines the workspace of the shape. The workspace, also known as reachable space, is important for robots and defines all places that the robot can reach. The workspace analysis can, for example, be used to compute the amount of potential collisions and interference in robotics, design and ergonomics. The current description applies to all areas where an accurate representation of a swept volume is required or desired, and the scope of the invention is not limited by the milling applications.

Milling Simulation

Figure 5:
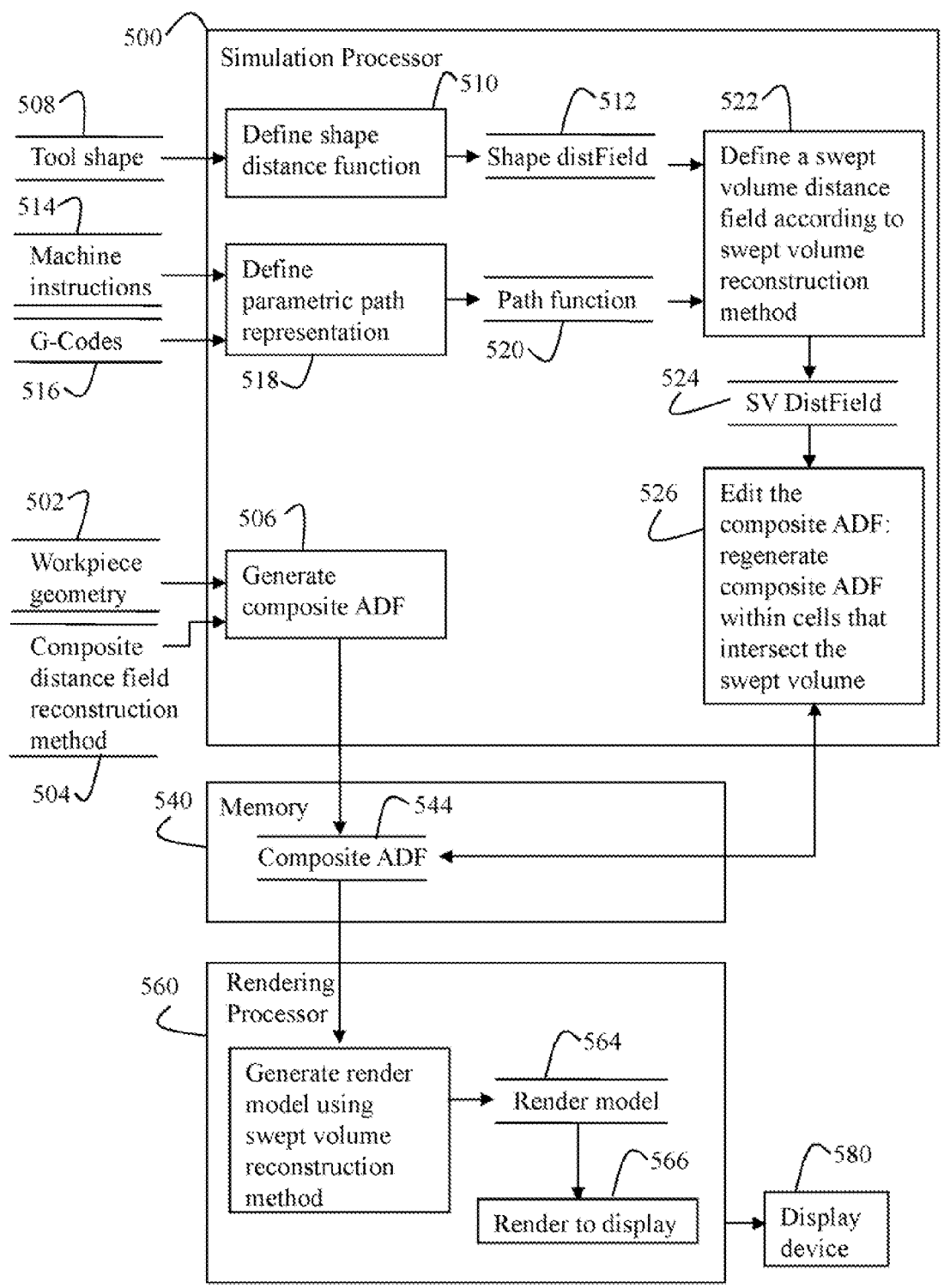
FIG. 5 is a flow diagram of method for simulating milling of a workpiece with a tool shape using a set of G-Codes or NC machine instructions according to an embodiment of the invention.

FIG. 5 shows a method for simulating milling of a workpiece with a tool shape using a simulation processor 500, storing a representation of the milled workpiece in a memory 540, and rendering the representation of the milled workpiece using a rendering processor 560 to a display device 580. The simulation of the milling is provided for illustration purposes only. Various embodiments use various types of machining simulation, such as drilling, milling, etc. The workpiece can be any object subjected to the simulation.

A shape of the workpiece and a method for reconstructing a composite distance field from a set of distance fields 504 are used to generate a composite ADF 544, which may be stored in the memory 540. The workpiece shape is specified by workpiece geometry 502, which comprises a set of geometric elements.

Each geometric element of the workpiece geometry is converted to a distance field representation, specifying a set of geometric element distance fields. Each geometric element distance field can be represented as one of an analytic distance function, an implicit distance function, a regularly sampled distance field, an ADF, a composition of distance functions, or a procedure, to name but a few.

In one embodiment, the composite ADF is stored in a memory as an octree, which is generated in a top down manner starting with a root cell enclosing a bounding box of the workpiece shape. A distance field representation of each particular geometric element in the workpiece geometry 502 is added to leaf cells of the composite ADF whose distance fields are influenced by the particular geometric element. During rendering and processing, the distance field of a particular leaf cell can be reconstructed at a sample point by combining the distance fields within the leaf cell using the composite distance field reconstruction method 504.

A variety of combining methods are possible and known in the art. In one embodiment, the combining uses a Boolean subtraction operator to simulate removal of material from the workpiece by the volume swept by the tool.

During ADF generation, leaf cells containing more than a specified maximum number of distance fields are subdivided to limit the complexity of the distance field within each leaf cell. Thus, composite ADFs are detail directed; larger cells occur in regions of the workpiece that are influenced by fewer distance fields and smaller cells occur in regions of the workpiece that are influenced by many distance fields.

The milling simulation method defines 510 a shape distance field 512 from a tool shape 508, where the shape distance field 512 can be one of an analytic distance function, an implicit distance function, a regularly sampled distance field, an ADF, a composition of distance functions, or a procedure, to name but a few.

An NC machine instruction 514, or alternatively, a G-Code 516, is used to define a parametric path function 520 corresponding to motion of the tool. For each tool motion, the shape distance field 512 and the parametric path function 520 are used to define 522 a swept volume distance field 524 representing the swept volume of the tool corresponding to the tool motion.

The composite ADF 544 is edited 526 with the swept volume distance field 524 to simulating milling of the workpiece with the tool motion. During editing, the swept volume distance field is added to cells of the composite ADF that are intersected by the swept volume of the tool, causing a regeneration of the ADF within the intersected cells.

The composite ADF can be used to generate 562 a render model 564, consisting of render model elements, and rendered 566 to the display device 580. Rendering methods known to the art, such as point rendering, triangle rendering, and ray tracing, can be used to generate and render the render model 564.

Distance fields have numerous advantages in physical simulation. An alternative embodiment for milling simulation uses distance fields to verify the NC milling process. For example, the composite ADF 544 generated by the milling simulator 500 can be compared to a distance field representation of the computer aided design model 102. The comparison can be made by visual inspection using the display device, 580.

Reconstructing a Distance Field of a Swept Volume

Figure 6:
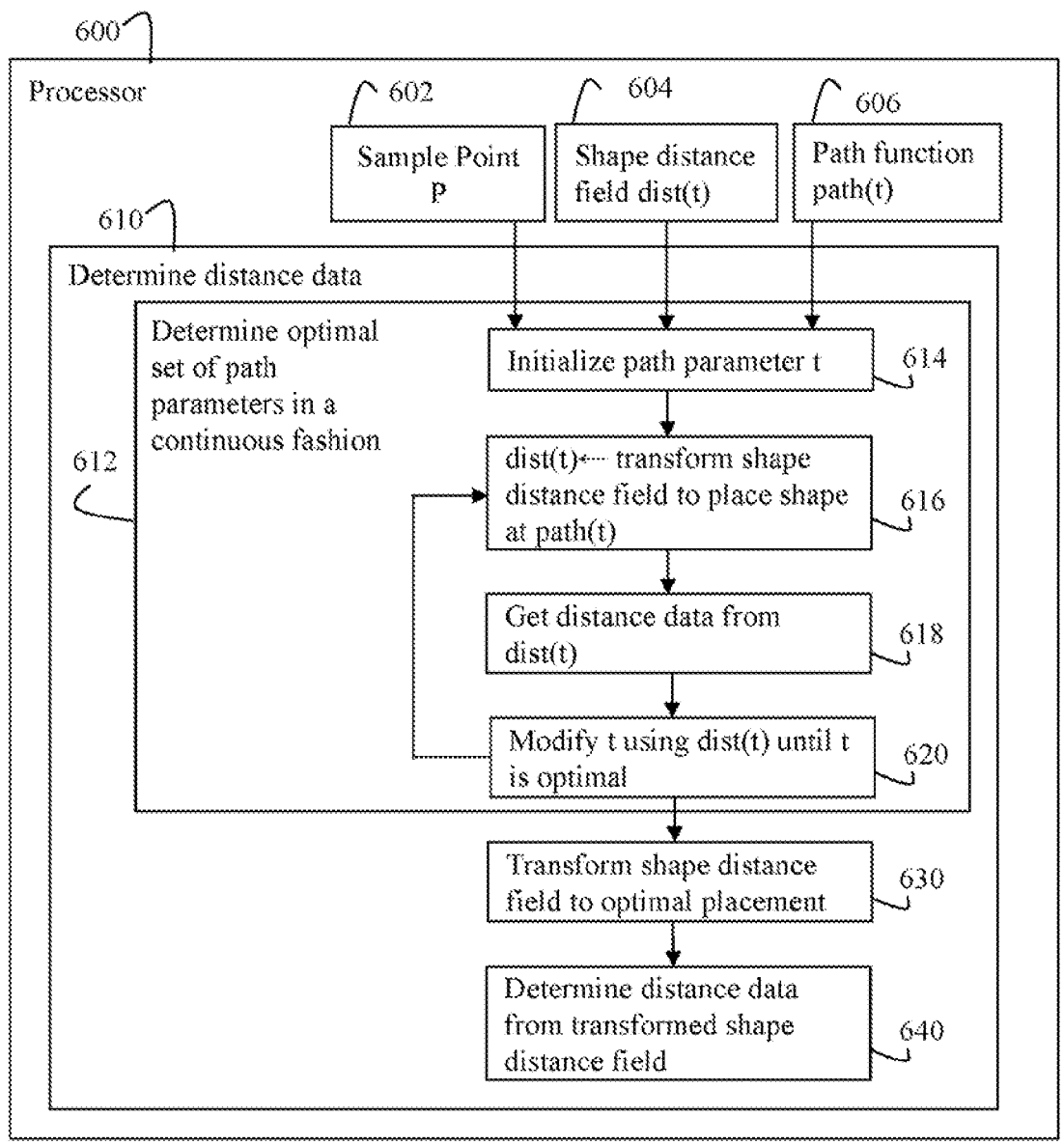
FIG. 6 is a flow diagram of a method for reconstructing a distance field of a swept volume at a sample point.

FIG. 6 shows a method for reconstructing a distance field of a swept volume at a sample instant of the simulation using a processor 600. A shape distance field 604 and parametric path function 606 specify a tool and a tool motion as described above. Given a sample point 602, a swept volume reconstruction method 610 determines distance data at the sample point 602 to reconstruct the distance field at the sample point. The method can determine 612, in a "continuous manner," an optimal placement of the tool along the path.

During the determination of the optimal set of parameters 612, an initial set of parameters defining an initial placement of the tool shape along the path is selected. In one embodiment, the path is parameterized by a single parameter t, which corresponds to time traveled by the tool along the path, and an initial value of t is selected 614. The shape distance field is transformed 616 to place the shape of the tool at the time t along the path and the shape distance field is reconstructed 618 at the sample point 602.

Distance data reconstructed at the sample point can include a distance from the sample point to the transformed shape, a gradient of the distance field, and a partial derivative of the distance field to name but a few.

The reconstructed distances are used to iteratively modify 620 the parametric value t to move the shape along the path to a placement closer to the sampling point. The modification can be done in a continuous manner, i.e., the parameter t is modified iteratively by an arbitrary amount in a direction that improves the position of shape along the path rather than by selecting t from a predefined set of discrete values. The modification is iterated until an optimal t has been determined, until the change in t between iterations is below some minimum change in t, or until a maximum number of iterations have occurred. Once the optimal t has been determined, the shape is transformed 630 to the corresponding optimal placement and distance data is reconstructed 640 from the transformed shape to determine 610 the distance data at the sample point 602.

The distance field can be used to measure certain geometric and physical properties of the material removed by each tool motion. In the present invention, for a particular tool motion, the engagement surface which is the intersection between the tool and the in-process workpiece is determined corresponding to the particular tool instance along tool path.

Analyzing Removed Volume

Figure 7:
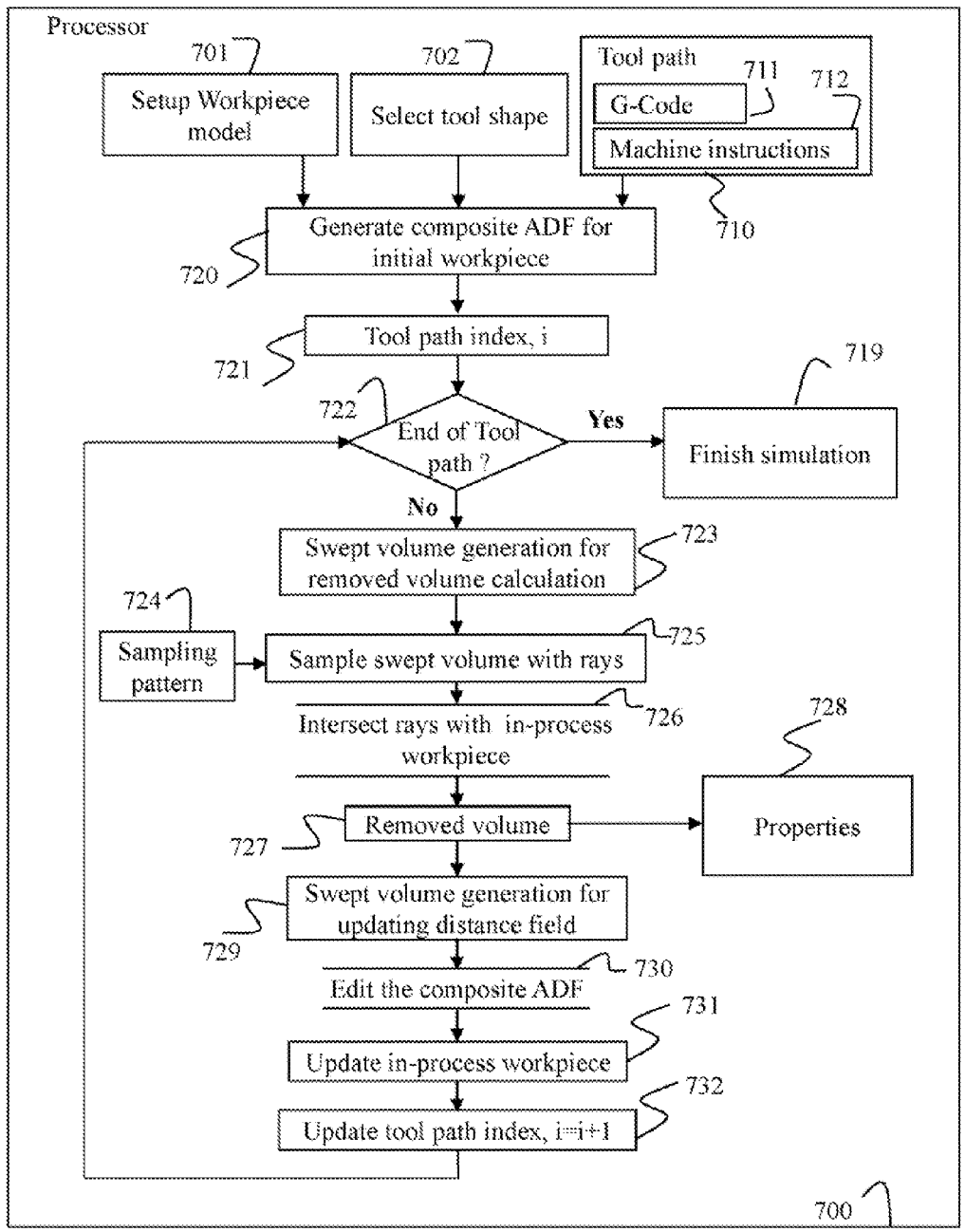
FIG. 7 is a flow diagram of a method for determining a removed volume and its geometric properties according to an embodiment of the invention.

FIG. 7 shows a flow diagram of a method 700 for determining and analyzing the volume of material removed by the tool moving along a tool path by using the composite ADFs based milling simulation. A model of the workpiece 701, a shape 702 of the tool and a tool path 710 are inputs to the method. The composite ADF is generated 720 to reconstruct an initial workpiece. The tool path index 721 is checked 722 to determine if the current tool instance is the final instance of the tool path to finish 719 the simulation. Otherwise, using a sampling pattern 724, a subset of the swept volume 723 is populated or sampled with rays 725.

In some embodiments, the workpiece is represented by a model of the workpiece including an object distance field defining a surface of the workpiece, the tool is represented by a model of the tool including a tool distance field defining a surface of the tool, and the motion is represented by at least one swept volume including a swept volume distance field defining a surface of the swept volume, and the path is represented by a parametric function.

Generation of swept volumes is done by swept volume distance fields in a continuous manner. A current swept volume corresponding to a segment of the path is sampled 725 with the set of rays. In one embodiment, the swept volume is modified by taking the Boolean difference of previous tool instance from the swept volume.

The rays intersecting 726 with the workpiece participate in forming the removed volume 727. Specifically, the rays are clipped against the workpiece according to the intersection test to determine the internal segments forming the removed volume. The internal segments of the rays have corresponding thickness and length, and can be combined to approximate the removed volume. In some embodiments, the collection of the internal segments is processed 728 to determine various properties of the material removed by the particular tool motion, such as its mass, volume, center of mass, width, thickness, length, inertia tensor or a moment of inertia. These properties can be evaluated by determining a boundary of the removed volume.

For general milling cases, each removed volume for given tool path segment can consist of multiple volume elements. For example, the boundaries of the removed volume can be extracted from these internal segments to compute surface integrals and moments of inertia. The length of the removed volume can be determined based on the length of the internal segments, e.g., based on a maximum length. The width of the removed volume can be determined based on a width of a slice of the internal segments. The volume of the removed material as well as its width, thickness and length affect the tool wear, which in turn affects the surface roughness significantly.

After the determination of removed volume for each tool path segment, the composite ADF 720 is edited 730 with the swept volume distance field 729 to simulate the milling of the workpiece with the tool motion. During the editing, the initial workpiece 720 is updated by the swept volume distance field to obtain in-process workpiece 730.

Figure 8A:
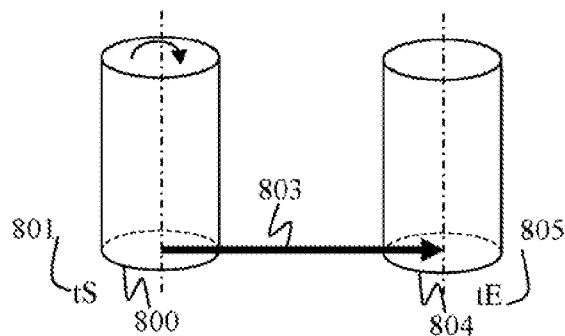
FIGS. 8A, 8B and 8C are diagrams of a segment of a path of a flat-end mill tool and the top view of swept volumes populated with rays according to exemplar sampling patterns.
Figure 8B:
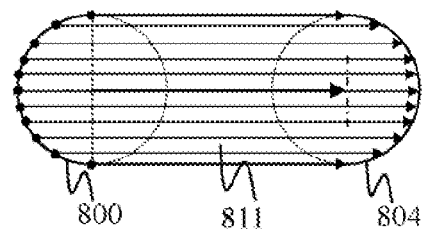

FIG. 8A shows a linear tool path 803 in the plane, in which a milling tool 800 at start time tS 801 is moved from initial position to final position 804 at an end time 805. FIG. 8B shows the top view of swept volume corresponding to flat-end mill tool and tool path in FIG. 8A.

In general, the region swept out by a rigid motion of a tool can be interpreted as enclosed by the boundaries of the tool at the previous and the next instances of the sweep, together with the surfaces swept out by the silhouette edges of the tool in the direction of sweep. The removed volume can be includes in the subset of the swept volume which is obtained by taking the Boolean difference of a volume of a tool in the previous position from the swept volume. Therefore, in one embodiment only this subset of the volume is sampled by the rays, which increases the efficiency of computation.

Figure 8C:
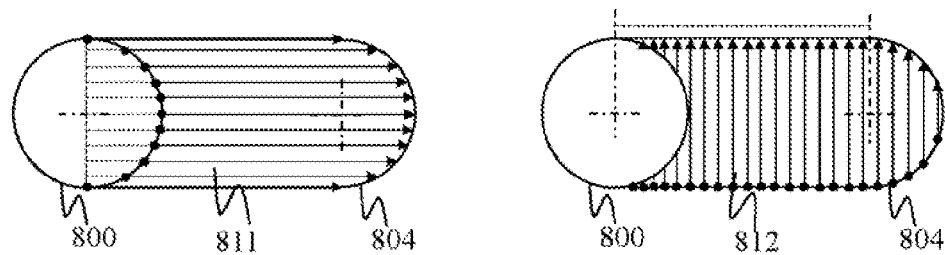
Figure 8C:
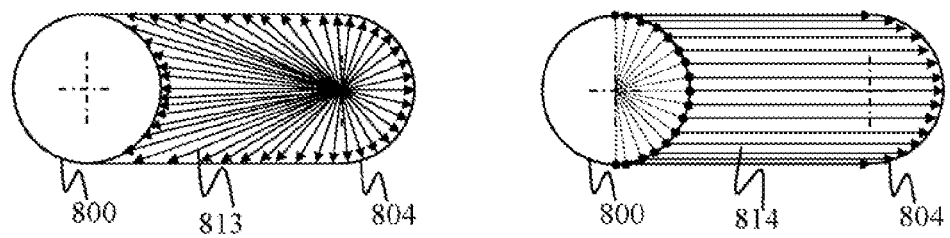

FIG. 8C shows a variety of sampling patterns 724 used for populating the swept volumes according to various embodiments. The sampling pattern can, for example, include a set of regularly spaced rays 811 in a Cartesian coordinate system in which the rays are equally spaced in axis perpendicular to tool path vector. The rays can also be equally spaced 812 in length of tool path along tool path vector. Alternately, the rays could be described in a cylindrical coordinate system wherein rays 813 are equally spaced in angle. Another sampling pattern 814 can be to place rays originating from points which are equally placed in angle and pointing to a direction of the path of the tool.

Figure 9A:
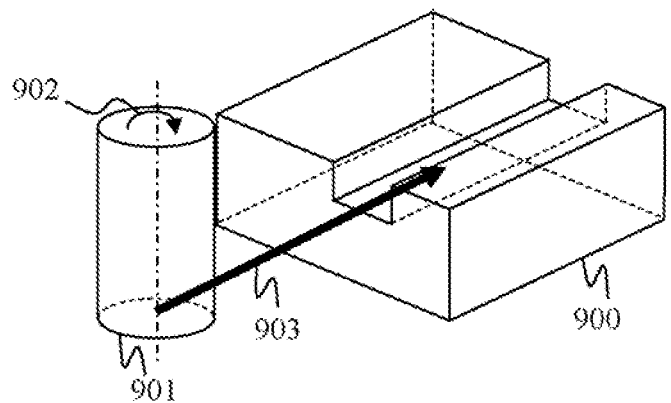
FIG. 9A is a diagram of the workpiece and the flat-end mill tool moving along a tool path.
Figure 9B:
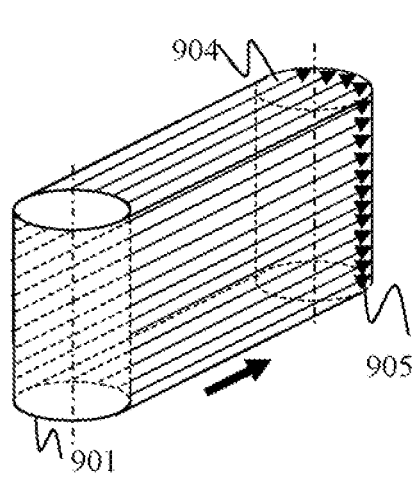
FIG. 9B is a diagram of sampled rays within the swept volume boundary corresponding to tool path segment.
Figure 9C:
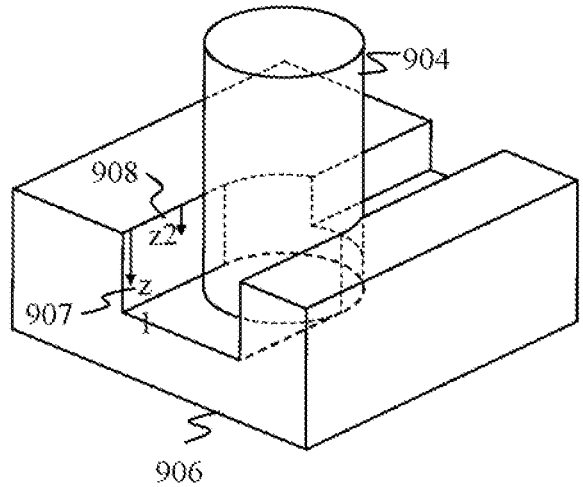
FIG. 9C is a diagram of in-process workpiece and tool instance showing a state of cutting performed by the flat-end mill tool.

FIG. 9A shows an embodiment simulating the flat-end mill tool 901 rotating in clockwise direction 902. The tool 901 moves along a straight tool path 903, and removes some material from the workpiece 900. FIG. 9B shows the swept volume and sampled rays 905 within this volume. FIG. 9C shows the in-process workpiece 906 and the final instance of the tool 904. The sampled rays 905 within the swept volume are intersected and clipped against the in-process workpiece. After determination of the internal segments of the rays that are inside the workpiece according to intersection test, the updated ray segments having certain thickness and height are summed to comprise the removed volume.

Figure 9D:
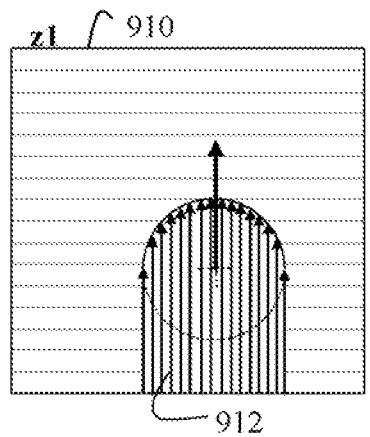
FIG. 9D is the top view of cross sections corresponding to FIG. 9C.
Figure 9D:
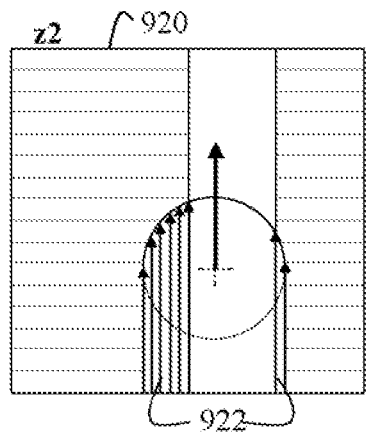

For given depth of depth values 907 and 908 of the milling, the cross sections of the in-process workpiece 910 and 920 are shown respectively in FIG. 9D. The internal segments 912 and 922 corresponding to slices of the removed volume are shown for the given depth of cut values. Although the removed volume for this tool and workpiece is one piece, the removed volume slice 922 has disconnected pieces.

A sampling pattern can have certain weaknesses and strengths depending on the shape of milling tool and tool path. For example, sampling the swept volume of flat-end mill in a Cartesian coordinate system, in which rays are equally spaced in length of tool path vector, under samples the regions close to the end of swept volume. One embodiment, casts rays originating from point which equally placed in angle along tool path direction to accurately represent the removed volume. Rays, according to this embodiment, are more uniformly distributed.

An alternate embodiment of the present invention determines the swept volumes with self-intersections. For example when the tool radius is greater than the circular path radius, self-intersection occurs within the swept volume. Modifications to the method have been developed for these special cases to sample the rays within the self-intersecting irregular swept volume.

Intersection of Rays

Figure 10A:
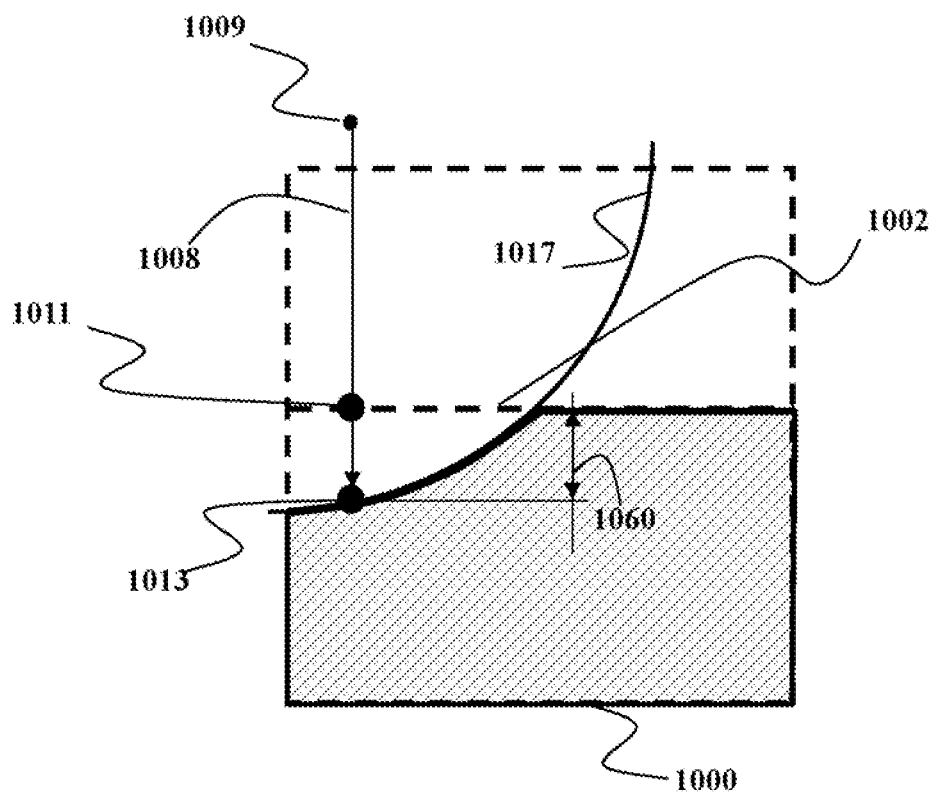
FIG. 10A is a two-dimensional schematic of intersection of rays with the boundaries of the workpiece.

FIG. 10A shows a two-dimensional (2D) illustration of the intersection of rays with the boundaries of the cells of composite ADF of the workpiece. For example, a ray 1008 originates from a point 1009, propagates in a straight line within the boundaries 1017 of the swept volume. The ray reaches the boundaries of the swept volume at point 1013 and intersects the boundary 1002 of the workpiece at point 1011. The boundary of the workpiece is modified by the boundary of the swept volume to update the surface 1002 and form in-process workpiece 1000. A segment of the ray 1060 between the points of intersection is the internal segment of the ray. In some embodiments, determining the points of intersection is based on values of the distance field at various points of the ray.

The point of intersection of the ray with the boundary of the swept volume is identified by a value s resulting in a zero value of the distance field of the swept volume, i.e., $d(R(s))=0$. Similarly, the point of intersection of the ray with the boundary of the workpiece is identified by a zero value of the distance field of the workpiece. The determination of the points of intersection problem can be formulated as a root finding problem. One embodiment of the invention determines the intersection analytically. Another embodiment uses an iterative procedure, such as Newton's method and/or the false position method, to determine the point of intersection between the ray and the boundaries of the swept volume or workpiece. Another embodiment uses sphere casting to determine the points of intersection.

Figure 10B:
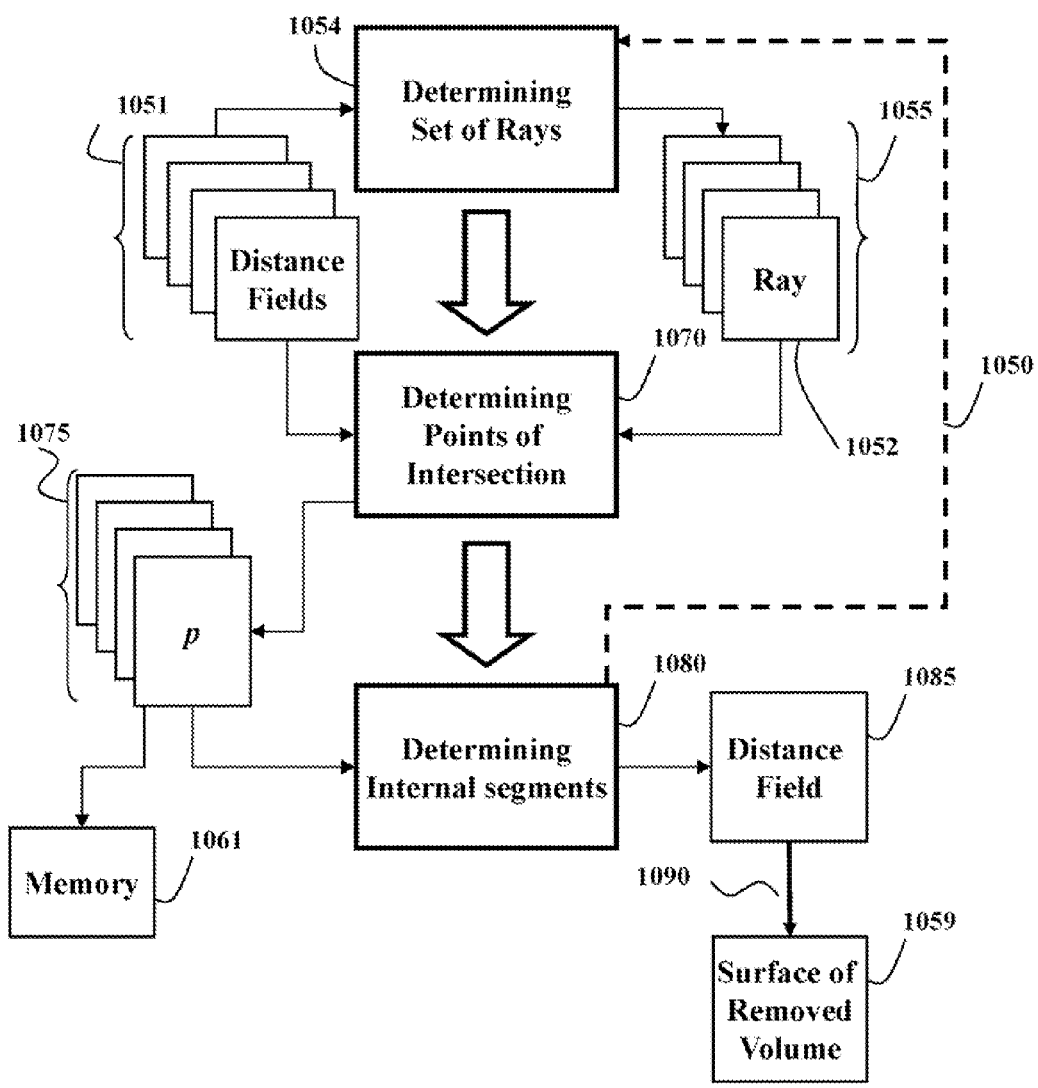
FIG. 10B is a block diagram of a method for determining internal segments based on distance field representation of the swept volume intersecting the workpiece according to embodiments of the invention.

FIG. 10B is a block diagram of a method for determining the internal segments based on distance field representation of the swept volume intersecting the workpiece. The corresponding distance fields 1051 and a set 1055 of the rays are inputs to the method.

Each ray 1052 from the set of rays is identified by a point of origin and a direction of propagation. The set of rays is determined 1054 such that the rays are internal to and populate substantially entire space of the swept volume. In some embodiments, the set of rays is determined based on the sampling pattern.

For each ray 1052 in the set of rays, the embodiments use aforementioned analytic and/or iterative methods to determine 1070 a set of points of intersection 1075 between the ray and the boundaries 1051. The points can be stores in a memory 1061. The internal segments are determined 1080 based on the points of intersection and can be represented using distance fields 1085 describing a surface of the removed volume 1059. For example, the internal segment can be determined based on a pair of points of the ray resulting in corresponding zero values of the distance field of the swept volume and the distance filed of the workpiece. After all rays in the set of rays are processed, the removed volume is determined.

Operating Environment

Various embodiments of the invention can be operated by numerous general purpose or special purpose computing system environments or configurations. Examples of well known computing systems, environments, and/or configurations that are suitable for use with the invention include, but are not limited to, personal computers, server computers, handheld or laptop devices, multiprocessor or multi-core systems, graphics processing units (GPUs), application-specific integrated circuits (ASICs), field programmable gate arrays (FPGAs), microcontroller-based systems, network PCs, mainframe computers, distributed computing environments that include any of the above systems or devices, and the like, i.e., generally processors.

For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format. A monitor or other type of display device 160 is connected to any of the above systems to enable visualization 162 of the invention.

Further, it should be appreciated that a computer may be embodied in any of a number of forms, such as a rack-mounted computer, a desktop computer, a laptop computer, minicomputer, or a tablet computer. Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a non-transitory computer-readable medium or multiple computer readable media, e.g., a computer memory, compact discs (CD), optical discs, digital video disks (DVD), magnetic tapes, and flash memories. The terms "program" or "software" are used herein in a generic sense to refer to any type of computer code or set of computer-executable instructions that can be employed to program a computer or other processor to implement various aspects of the present invention as discussed above.

Computer-executable instructions may be in many forms, such as program modules, executed by one or more computers or other devices. Generally, program modules include routines, programs, objects, components, data structures that perform particular tasks or implement particular abstract data types. Typically the functionality of the program modules may be combined or distributed as desired in various embodiments.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for simulating a machining of a workpiece by a tool, comprising the steps of:
    populating a space internal to a swept volume representing a motion of the tool in relation to the workpiece with a set of rays, wherein the rays are parallel to each other and are bound by a silhouette of the swept volume;
    determining intersections of at least some rays with the workpiece;
    clipping the rays according to the intersection to determine internal segments of the rays, wherein the internal segment of the rays are internal to both the swept volume, and the workpiece; and
    determining a volume removed from the workpiece by the swept volume based on the internal segments of the rays, wherein the steps of the method are performed by a processor.

2. The method of claim 1, further comprising:
    generating the swept volume for a segment of a path of the tool, the segment defines the motion of the tool from a previous position to a next position of the tool during the simulation, further comprising:
    performing the steps of the method iteratively until the tool reaches a final position of the simulating.

3. The method of claim 1, further comprising:
    determining the removed volume based on at least some of a number of the internal segments, distances between the internal segments, length of the internal segments, and thickness of the internal segments.

4. The method of claim 1, further comprising:
    determining geometric properties of the removed volume.

5. The method of claim 1, further comprising:
    determining, based on the removed volume, properties of material removed by the motion, wherein the properties include at least one of a mass of the material, a volume, of the material, a center of the mass of the material, a width, a thickness, a length of the material, and inertia of the material.

6. The method of claim 1, further comprising:
    populating the swept volume with the set of rays according to a sampled pattern.

7. The method of claim 1, further comprising:
    updating the swept volume before the populating by subtracting a volume of the tool in a previous position from the swept volume.

8. The method of claim 6, wherein the sampling pattern includes the set of rays in a Cartesian coordinate system, such that that the rays are equally spaced in axis perpendicular to a tool path vector.

9. The method of claim 6, wherein the sampling pattern includes the set of rays in a cylindrical coordinate system equally spaced in an angle.

10. The method of claim 6, wherein the sampling pattern includes the set of rays spaced equally along angles, and pointing to a direction of a path of the tool.

11. A method for simulating a machining of a workpiece by a tool, wherein the workpiece is represented by a workpiece distance field, the tool is represented by a tool distance field, and the motion of the tool with respect to the workpiece is represented by a swept volume distance field, comprising:
    casting a set of rays within the swept volume, wherein the rays are parallel to each other and are bound by a silhouette of the swept volume;
    determining internal segments of the rays based on points on at least some rays resulting in corresponding zero values of the swept volume distance field and the workpiece distance tiled, wherein the internal segment of the rays are internal to both the swept volume and the workpiece; and
    combining the internal segments to determine a removed volume based on at least some of a number of the internal segments, distances between the internal segments, length of the internal segments, and thickness of the internal segments, wherein steps of the method are performed by a processor.

12. The method of claim 11, further comprising:
    determining geometric properties of the removed volume.

13. The method of claim 11, further comprising:
    determining properties of material removed by the motion of the tool based on the removed volume.

14. A system for simulating a machining of a workpiece by a tool, wherein the workpiece is represented by a workpiece distance field, the tool is represented by a tool distance field, and the motion of the tool with respect to the workpiece is represented by a swept volume distance field, comprising:
  a processor for casting a set of rays in a space internal to the swept volume, wherein the rays are parallel to each other and are bound by a silhouette of the swept volume and for determining a removed volume based on points on at least some rays resulting in zero values of the swept volume distance field and the workpiece distance tiled producing internal segment of the rays are internal to both the swept volume and the workpiece.

* * * * *